United States Patent
Liu et al.

(10) Patent No.: US 10,629,583 B2
(45) Date of Patent: Apr. 21, 2020

(54) TRANSIENT VOLTAGE SUPPRESSION DEVICE

(71) Applicant: uPI Semiconductor Corp., Hsinchu County (TW)

(72) Inventors: Yu-Hsuan Liu, Hsinchu County (TW); Chih-Hao Chen, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 0 days.

(21) Appl. No.: 16/178,607

(22) Filed: Nov. 2, 2018

(65) Prior Publication Data
US 2019/0371785 A1   Dec. 5, 2019

(30) Foreign Application Priority Data

Jun. 5, 2018   (TW) .............................. 107119389 A

(51) Int. Cl.
| | |
|---|---|
| *H01L 29/866* | (2006.01) |
| *H01L 27/02* | (2006.01) |
| *H01L 23/58* | (2006.01) |
| *H01L 27/08* | (2006.01) |
| *H01L 23/60* | (2006.01) |
| *H01L 29/861* | (2006.01) |
| *H01L 23/62* | (2006.01) |
| *H01L 23/528* | (2006.01) |

(52) U.S. Cl.
CPC ........ *H01L 27/0248* (2013.01); *H01L 23/585* (2013.01); *H01L 23/60* (2013.01); *H01L 23/62* (2013.01); *H01L 27/0814* (2013.01); *H01L 29/866* (2013.01); *H01L 29/8611* (2013.01); *H01L 23/528* (2013.01)

(58) Field of Classification Search
CPC ..... H01L 23/60; H01L 23/62; H01L 29/8611; H01L 29/8613
USPC .......................................... 257/106, 355, 603
See application file for complete search history.

(56) References Cited

U.S. PATENT DOCUMENTS

| | | | | |
|---|---|---|---|---|
| 5,338,964 A | * | 8/1994 | Bernier ............... | H01L 27/0248 257/355 |
| 6,441,439 B1 | * | 8/2002 | Huang ................ | H01L 27/0259 257/355 |
| 6,788,507 B2 | * | 9/2004 | Chen ................... | H01L 27/0255 257/494 |
| 7,880,223 B2 | | 2/2011 | Bobde | |

(Continued)

*Primary Examiner* — David Vu
*Assistant Examiner* — Brandon C Fox
(74) *Attorney, Agent, or Firm* — JCIPRNET

(57) ABSTRACT

A transient voltage suppression device including a substrate and a first transient voltage suppressor is provided. The substrate includes a device region and a seal-ring region. The seal-ring region surrounds the device region. A first transient voltage suppressor is located in the device region. The first transient voltage suppressor includes a first well region having a first conductivity type, a first doped region having a second conductivity type, and a second doped region having the second conductivity type. The first well region is located in the substrate of the device region. The first doped region is located in the first well region. The second doped region is located in the first well region. A third doped region having the second conductivity type is located in the substrate of the seal-ring region, and the third doped region is electrically connected to the first doped region.

14 Claims, 4 Drawing Sheets

(56) References Cited

U.S. PATENT DOCUMENTS

| | | |
|---|---|---|
| 9,099,485 B2 | 8/2015 | Yu et al. |
| 9,633,989 B2 | 4/2017 | Kato et al. |
| 10,134,722 B2 * | 11/2018 | Yam .................... H01L 27/0262 |
| 2009/0045457 A1 * | 2/2009 | Bobde ................. H01L 27/0255 |
| | | 257/328 |
| 2014/0167169 A1 * | 6/2014 | He ...................... H01L 27/0255 |
| | | 257/355 |

* cited by examiner

TRANSIENT VOLTAGE SUPPRESSION DEVICE

CROSS-REFERENCE TO RELATED APPLICATION

This application claims the priority benefit of Taiwan application serial no. 107119389, filed on Jun. 5, 2018. The entirety of the above-mentioned patent application is hereby incorporated by reference herein and made a part of this specification.

BACKGROUND

Technical Field

The invention relates to an integrated circuit. More particularly, the invention relates to a transient voltage suppression device.

Description of Related Art

Generally, electronic products are vulnerable to be impacted by sudden and uncontrollable electrostatic discharge (ESD) or surge, and the electronic products may thus be damaged beyond repair. At present, the adoption of transient voltage suppressors (TVSs) provides a relatively effective solution to solve the electrostatic discharge or surge problem.

With technology advancement, development of various types of electronic products have been following the trend of high speed, high efficiency, light weight, and compact size. Nevertheless, the capability of the transient voltage suppressors to protect against electrostatic discharge and surge is reduced as device sizes become more compact under such trend, and thus, the transient voltage suppressors become less likely to withstand high-power energy. Therefore, how to enhance the capability of devices to protect against electrostatic discharge and surge within a limited layout area is an important issue.

SUMMARY

The invention provides a transient voltage suppression device in which a doped region in a seal-ring region is electrically connected to a transient voltage suppressor, so as to increase an effective area of the device and further enhance resistance to electrostatic discharge and surge.

In an embodiment of the invention, a transient voltage suppression device includes a substrate and a first transient voltage suppressor. The substrate includes a device region and a seal-ring region. The seal-ring region surrounds the device region. A first transient voltage suppressor is located in the device region. The first transient voltage suppressor includes a first well region having a first conductivity type, a first doped region having a second conductivity type, and a second doped region having the second conductivity type. The first well region is located in the substrate of the device region. The first doped region is located in the first well region. The second doped region is located in the first well region. A third doped region having the second conductivity type is located in the substrate of the seal-ring region, and the third doped region is electrically connected to the first doped region.

In an embodiment of the invention, the second doped region is disposed between the first doped region and the third doped region.

In an embodiment of the invention, the first doped region, the second doped region, and the third doped region are separated from one another.

In an embodiment of the invention, a gate structure is free from on the first well region between the first doped region and the second doped region.

In an embodiment of the invention, the transient voltage suppression device further includes a second transient voltage suppressor located in the device region. The second transient voltage suppressor includes a second well region having the first conductivity type, a fifth doped region having the second conductivity type, and a sixth doped region having the second conductivity type. The second well region is located in the substrate of the device region. The fifth doped region is located in the second well region. The sixth doped region is located in the second well region. The seventh doped region having the second conductivity type is located in the substrate of the seal-ring region.

In an embodiment of the invention, the first doped region, the third doped region, the fifth doped region, and the seventh doped region are electrically connected to a first voltage V1, and the second doped region and the sixth doped region are electrically connected to a second voltage V2. The first voltage and the second voltage are different.

In an embodiment of the invention, the first doped region, the third doped region, and the sixth doped region are electrically connected to the first voltage, and the second doped region, the fifth doped region, and the seventh doped region are electrically connected to the second voltage. The first voltage and the second voltage are different.

In an embodiment of the invention, the substrate further includes a scribe line region. The scribe line region is adjacent to the seal-ring region, and the seal-ring region is located between the device region and the scribe line region.

In an embodiment of the invention, the transient voltage suppression device further includes a fourth doped region having the second conductivity type, and the fourth doped region is located in the substrate of the scribe line region. The fourth doped region is located aside and in contact with the third doped region.

In an embodiment of the invention, the transient voltage suppression device further includes a metal layer disposed on the substrate, and the metal layer is free from on the fourth doped region.

In an embodiment of the invention, the second transient voltage suppressor includes a plurality of second transient voltage suppressors. A plurality of the second well regions in the plurality of the second transient voltage suppressors are separated from one another and are not connected to one another.

In an embodiment of the invention, the first transient voltage suppressor and the second transient voltage suppressor are Zener diodes with bi-directional discharge.

In an embodiment of the invention, the first well region and the second well region are both electrically floating.

In an embodiment of the invention, the substrate has the second conductivity type and is electrically floating.

To sum up, in the invention, the third doped region in the seal-ring region is electrically connected to the transient voltage suppressor, as such, the effective area of the device is increased, and that the endurance to electrostatic discharge and surge is enhanced. In addition, the transient voltage suppression device of the invention further includes the fourth doped region formed in the substrate of the scribe line region. In this way, the fourth doped region is in contact with the third doped region, so as to shunt the electrostatic discharge current or the surge current.

In addition, the number of the transient voltage suppressors is plural, and the plural transient voltage suppressors are Zener diodes with bi-directional discharge. Therefore, the electrostatic discharge current or the surge current can be shunted into the third doped region in the seal-ring region and the fourth doped region in the scribe line region at the two sides of the device region, as such, the equivalent capacitance is lowered and the operation speed is further enhanced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
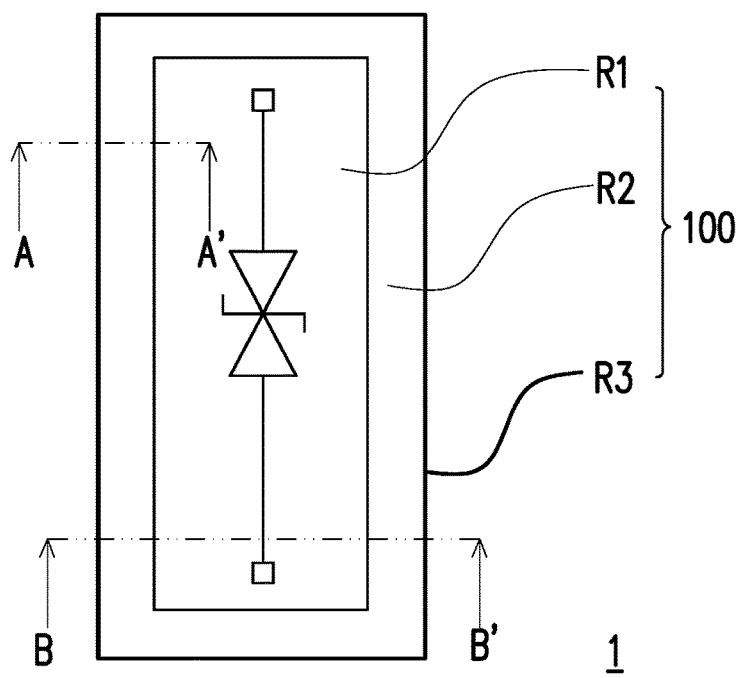
FIG. 1 is a schematic top view of a transient voltage suppression device according to a first embodiment of the invention.

The invention is more comprehensively described with reference to the figures of the present embodiments. However, the invention may also be implemented in different forms rather than being limited by the embodiments described in the invention. The thicknesses of the layers and regions in the figures are enlarged for clarity. The same or similar reference numerals represent the same or similar devices and are not repeated in the following paragraphs.

In the following embodiments, when a first conductivity type is P-type, a second conductivity type is N-type. When the first conductivity type is N-type, the second conductivity type is P-type. In this embodiment, the first conductivity type may be implemented as P-type, and the second conductivity type may be implemented as N-type. Nevertheless, the invention is not limited thereto.

FIG. 1 is a schematic top view of a transient voltage suppression device according to a first embodiment of the invention. Although only one device region R1 is illustrated in FIG. 1, the invention is not limited thereto. In other embodiments, a plurality of the device regions R1 may also be provided, and the device regions R1 are separated from one another through mesh-shaped scribe line regions R3.

With reference to FIG. 1, in the first embodiment of the invention, a transient voltage suppression device 1 includes a substrate 100. The substrate 100 includes the device region R1, a seal-ring region R2, and the scribe line region R3. As shown in FIG. 1, the seal-ring region R2 is an enclosed annular region surrounding the device region R1. The scribe line region R3 is adjacent to the seal-ring region R2. The scribe line region R3 is also an enclosed annular region surrounding the seal-ring region R2, as such, the seal-ring region R2 is located between the device region R1 and the scribe line region R3. In an embodiment, the device region R1 is configured to accommodate a transient voltage suppressor, a diode device, etc. The seal-ring region R2 provides a reserved space, so as to protect an internal circuit in the device region R1 from be damaged caused by die sawing. In a die sawing process, the scribe line region R3 provides a space for a blade to pass through, as such, a wafer may be diced into a plurality of dies (or a plurality of device regions R1).

Figure 2A:
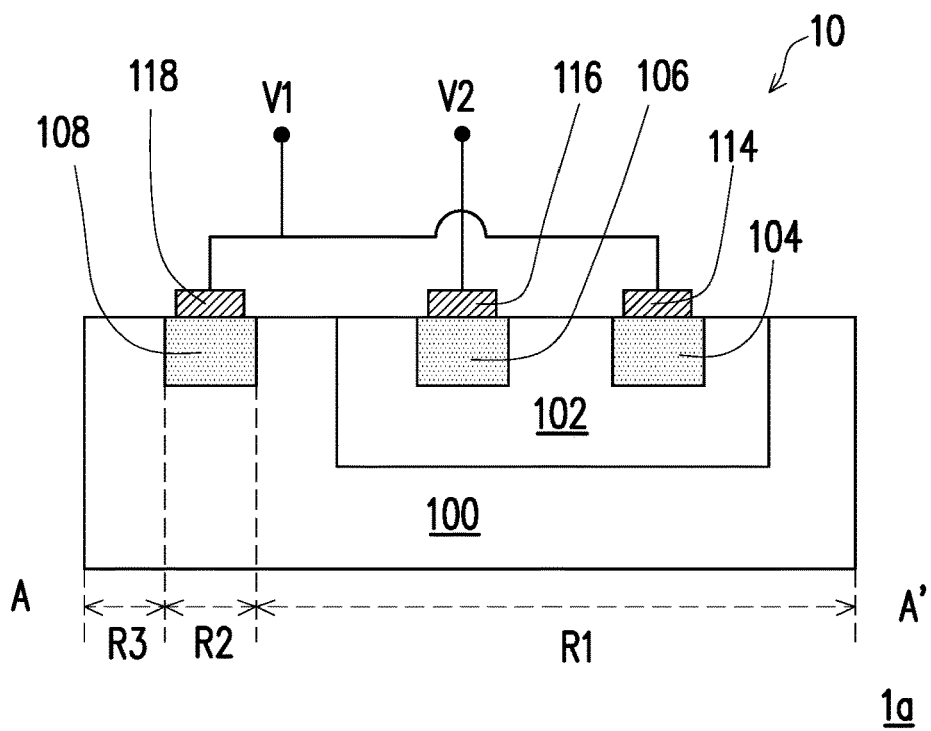
FIG. 2A is a schematic cross-sectional view along a line A-A' of FIG. 1.

FIG. 2A is a schematic cross-sectional view along a line A-A' of FIG. 1. FIG. 2A may be regarded as one schematic cross-sectional view of the transient voltage suppression device 1 of FIG. 1.

With reference to FIG. 2A, a transient voltage suppression device 1a of this embodiment includes a first transient voltage suppressor 10 located in the substrate 100 of the device region R1. In this embodiment, the first transient voltage suppressor 10 is a Zener diode with bi-directional discharge, but the invention is not limited thereto.

In an embodiment, the substrate 100 is electrically floating. The substrate 100 is a semiconductor substrate, a semiconductor compound substrate, or a semiconductor over insulator (SOI) substrate, for example. In this embodiment, the substrate 100 may be a N-type doped substrate. Nevertheless, the invention is not limited thereto, and the substrate 100 may be a P-type doped substrate in other embodiments.

To be specific, the first transient voltage suppressor 10 includes a first well region 102 having a first conductivity type, a first doped region 104 having a second conductivity type, and a second doped region 106 having the second conductivity type.

The first well region 102 is located in the substrate 100 of the device region R1. In an embodiment, the first well region 102 is a P-type well region and is electrically floating.

The first doped region 104 is located in the first well region 102, and the second doped region 106 is located in the first well region 102. In an embodiment, the first doped region 104 and the second doped region 106 are separated from each other and are not connected to each other. The first doped region 104 and the first well region 102 have different conductivity types and constitute as a diode. The second doped region 106 and the first well region 102 also have different conductivity types and constitute as another diode. A doping concentration of the first doped region 104 and a doping concentration of the second doped region 106 are identical, but the invention is not limited thereto.

As shown in FIG. 2A, in addition to the first doped region 104 and the second doped region 106, other doped region having the second conductivity type (i.e., a N-type doped region) is free from in the first well region 102. In an embodiment, a gate structure is free from on the first well region 102 between the first doped region 104 and the second doped region 106. That is, the first well region 102, the first doped region 104, and the second doped region 106 may be combined to form a diode device rather than a field effect transistor device.

The transient voltage suppression device 1a of this embodiment further includes a third doped region 108 having the second conductivity type, and the third doped region 108 is located in the substrate 100 of the seal-ring region R2. As shown in FIG. 2A, the second doped region 106 is located between the first doped region 104 and the third doped region 108. The first doped region 104, the second doped region 106, and the third doped region 108 are separated from one another and are not connected to one another. The third doped region 108 and the first doped region 104 are electrically connected to a first voltage V1, and the second doped region 106 is electrically connected to a second voltage V2. In an embodiment, the first voltage V1 and the second voltage V2 are different. For instance, when the first voltage V1 is a power supply voltage (VDD), the second voltage V2 is a ground voltage (GND). In another embodiment, when the first voltage V1 is the ground voltage, the second voltage V2 is the power supply voltage.

From another perspective, in this embodiment, the third doped region 108 in the seal-ring region R2 is electrically connected to the first doped region 104 of the first transient voltage suppressor 10, as such, an effective area of the device is increased, and the endurance with respect to electrostatic discharge and surge is further enhanced. That is, in this embodiment, the transient voltage suppression device 1a is able to increase a protection capability of the device against the electrostatic discharge and surge within a limited layout area.

In addition, the transient voltage suppression device 1a of the FIG. 2A further includes a metal layer 114, a metal layer 116, and a metal layer 118 respectively disposed on the first doped region 104, the second doped region 106, and the third doped region 108 for reducing resistance values between the doped regions and conductive lines. In an embodiment, the material of the metal layer 114, the metal layer 116, and the metal layer 118 includes aluminum, titanium, copper, nickel, tungsten, or alloy thereof but is not limited to the foregoing materials.

Figure 2B:
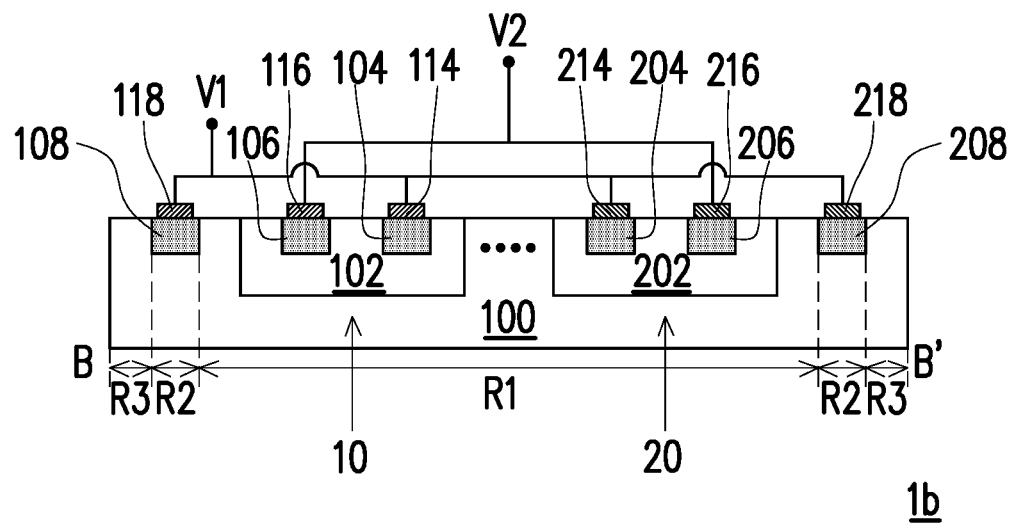
FIG. 2B is a schematic cross-sectional view taken along a line B-B' of FIG. 1.

FIG. 2B is a schematic cross-sectional view taken along a line B-B' of FIG. 1. Incidentally, FIG. 2B may be regarded as another schematic cross-sectional view of the transient voltage suppression device 1 of FIG. 1.

With reference to FIG. 2A and FIG. 2B, basically, a transient voltage suppression device 1b of FIG. 2B is similar to the transient voltage suppression device 1a of FIG. 2A. A difference therebetween is that the transient voltage suppression device 1b of FIG. 2B further includes a second transient voltage suppressor 20 located in the substrate 100 of the device region R1. In this embodiment, the second transient voltage suppressor 20 is a Zener diode with bi-directional discharge, but the invention is not limited thereto.

To be specific, the second transient voltage suppressor 20 includes a second well region 202 having the first conductivity type, a fifth doped region 214 having the second conductivity type, and a sixth doped region 216 having the second conductivity type.

The second well region 202 is located in the substrate 100 of the device region R1. In an embodiment, the second well region 202 and the first well region 102 are separated from each other and are not connected to each other as shown in FIG. 2B. In an embodiment, the second well region 202 is a P-type well region and is electrically floating.

The fifth doped region 204 is located in the second well region 202, and the sixth doped region 206 is located in the second well region 202. In an embodiment, the fifth doped region 204 and the sixth doped region 206 are separated from each other and are not connected to each other. In this embodiment, the fifth doped region 204 and the second well region 202 have different conductivity types and may constitute as a diode. The sixth doped region 206 and the second well region 202 also have different conductivity types and constitute as another diode. Similarly, as shown in FIG. 2B, a gate structure is free from or not provided on the second well region 202 between the fifth doped region 204 and the sixth doped region 206.

In addition, the transient voltage suppression device 1b of FIG. 2B further includes a seventh doped region 208 having the second conductivity type, and the seventh doped region 208 is located in the substrate 100 of the seal-ring region R2. As shown in FIG. 2B, the sixth doped region 206 is located between the fifth doped region 204 and the seventh doped region 208. The fifth doped region 204, the sixth doped region 206, and the seventh doped region 208 are separated from one another and are not connected to one another. The first doped region 104, the third doped region 108, the fifth doped region 204, and the seventh doped region 208 are electrically connected to the first voltage V1, and the second doped region 106 and the sixth doped region 206 are electrically connected to the second voltage V2. In an embodiment, the first voltage V1 and the second voltage V2 are different. For instance, when the first voltage V1 is the power supply voltage, the second voltage V2 is the ground voltage, and vice versa.

As shown in FIG. 1 and FIG. 2B, the third doped region 108 and the seventh doped region 208 may be connected to each other and extending along the seal-ring region R2 to form an annular doped region. The annular doped region surrounds the first transient voltage suppressor 10 and the second transient voltage suppressor 20 in the device region R1.

Although only one second transient voltage suppressor 20 is illustrated in FIG. 2B, the invention is not limited thereto. In other embodiments, a number of the second transient voltage suppressor 20 may be plural. A plurality of the second well regions 202 in a plurality of the second transient voltage suppressors 20 are separated from one another and are not connected to one another.

When the number of the second transient voltage suppressors 20 is plural, the second transient voltage suppressors 20 are Zener diodes with bi-directional discharge and are connected in series with the first transient voltage suppressor 10. In such configuration, an electrostatic discharge current or a surge current may be shunted into the third doped region 108 and the seventh doped region 208 in the seal-ring region R2 at two sides of the device region R1, as such, equivalent capacitance is lowered and an operation speed is further enhanced.

As shown in FIG. 2B, the transient voltage suppression device 1b further includes the metal layer 214, the metal layer 216, and the metal layer 218 respectively disposed on the fifth doped region 204, the sixth doped region 206, and the seventh doped region 208 for reducing the resistance values between the doped regions and the conductive lines. In an embodiment, the material of the metal layer 214, the metal layer 216, and the metal layer 218 includes aluminum, titanium, copper, nickel, tungsten, or alloy thereof but is not limited to the foregoing materials.

Figure 2C:
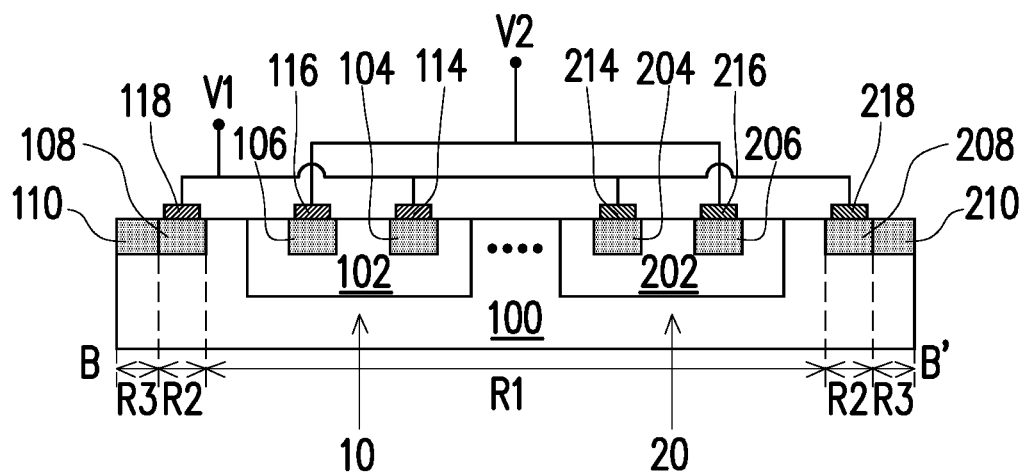
FIG. 2C is a schematic cross-sectional view taken along the line B-B' of FIG. 1.

FIG. 2C is a schematic cross-sectional view taken along the line B-B' of FIG. 1. FIG. 2C may be regarded as still another schematic cross-sectional view of the transient voltage suppression device 1 of FIG. 1.

With reference to FIG. 2B and FIG. 2C, basically, a transient voltage suppression device 1c of FIG. 2C is similar to the transient voltage suppression device 1b of FIG. 2B. A difference therebetween is that the transient voltage suppression device 1c of FIG. 2C further includes a fourth doped region 110 having the second conductivity type and an eighth doped region 210 having the second conductivity type. The fourth doped region 110 is located in the substrate 100 of the scribe line region R3, is located aside or next to the third doped region 108, and is in contact with the third doped region 108. The eighth doped region 210 is located in the substrate 100 of the scribe line region R3, is located aside or next to the seventh doped region 208, and is in contact with the seventh doped region 208. As shown in FIG. 1 and FIG. 2C, the fourth doped region 110 and the eighth doped region 210 may be connected to each other and extending along the scribe line region R3 to form an annular doped region. The annular doped region surrounds the seal-ring region R2. In an embodiment, the fourth doped region 110 may be electrically connected to the first voltage V1 through the third doped region 108. Similarly, the eighth doped region 210 may also be electrically connected to the first voltage V1 through the seventh doped region 208. That is, the third doped region 108 and the seventh doped region 208 in the seal-ring region R2 and the fourth doped region 110 and the eighth doped region 210 in the scribe line region R3 share a same electrical potential.

In an embodiment, the metal layer is free from or not provided on the fourth doped region 110 and the eighth doped region 210 in the scribe line region R3, as such, the metal layer is prevented from being stuck onto an edge of the blade during the die sawing process, which may lead to blade blasting or die cracking. In addition, the fourth doped region 110 and the third doped region 108 are in contact with each other, and the eighth doped region 210 and the seventh doped region 208 are in contact with each other, as such, the electrostatic discharge current or the surge current can be shunted, and that the protection capability against electrostatic discharge and surge is enhanced.

Besides, the number of the second transient voltage suppressors 20 is plural. The second transient voltage suppressors 20 are Zener diodes with bi-directional discharge and are connected in series with the first transient voltage suppressor 10. In such configuration, the electrostatic discharge current or the surge current may be shunted into the third doped region 108 and the seventh doped region 208 in the seal-ring region R2 at the two sides of the device region R1 and the fourth doped region 110 and the eighth doped region 210 in the scribe line region R3, as such, the equivalent capacitance is lowered and the operation speed is further enhanced.

Figure 3:
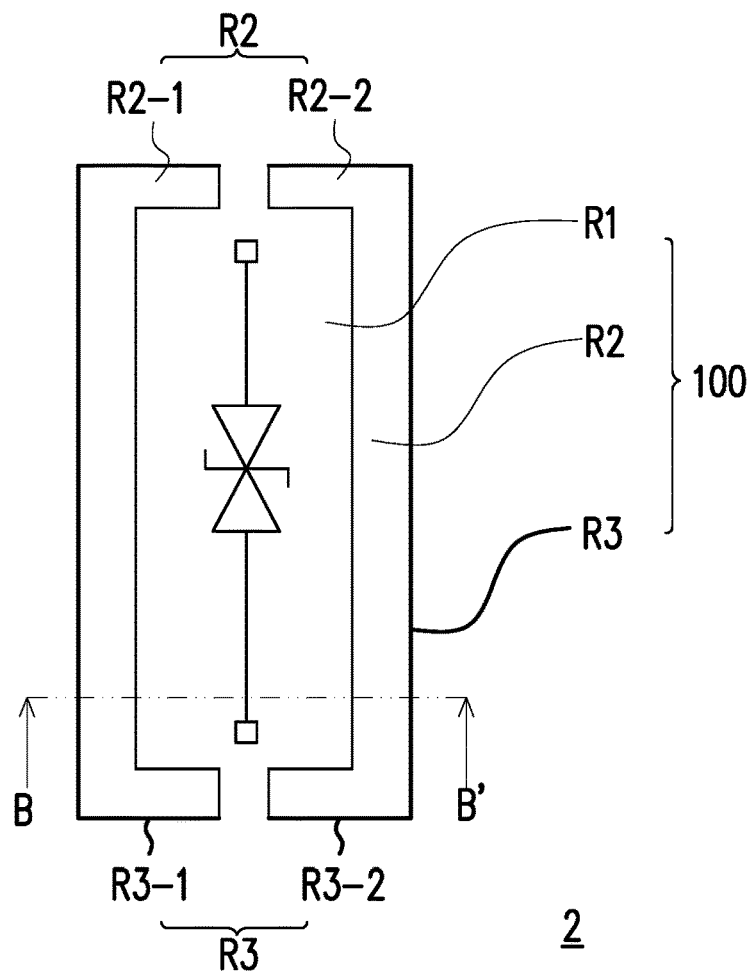
FIG. 3 is a schematic top view of a transient voltage suppression device according to a second embodiment of the invention.
Figure 4A:
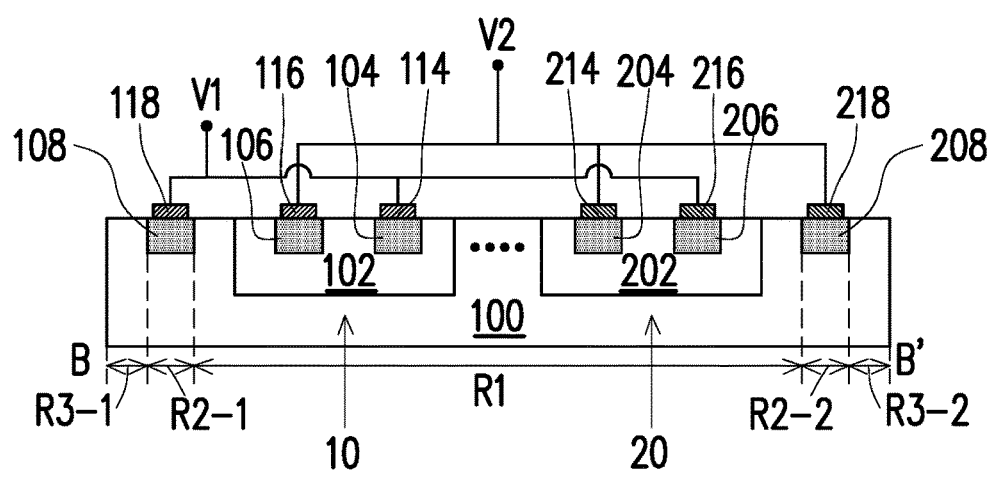
FIG. 4A is a schematic cross-sectional view taken along a line B-B' of FIG. 3.

FIG. 3 is a schematic top view of a transient voltage suppression device according to a second embodiment of the invention. FIG. 4A is a schematic cross-sectional view taken along a line B-B' of FIG. 3.

With reference to FIG. 1 and FIG. 3, basically, a transient voltage suppression device 2 of the second embodiment is similar to the transient voltage suppression device 1 of the first embodiment. A difference therebetween is that the seal-ring region R2 of the transient voltage suppression device 2 of the second embodiment is not an enclosed annular region. The seal-ring region R2 of the transient voltage suppression device 2 of the second embodiment is divided into two regions R2-1 and R2-2 respectively disposed at two sides of the device region R1. The scribe line region R3 of the transient voltage suppression device 2 of the second embodiment is also divided into two regions R3-1 and R3-2 respectively disposed next to the two regions R2-1 and R2-2 of the seal-ring region R2.

With reference to FIG. 1 and FIG. 4A together, the third doped region 108 is disposed in the substrate 100 of the region R2-1, and the seventh doped region 208 is disposed in the substrate 100 of the region R2-2. The third doped region 108 and the seventh doped region 208 are separated from each other and are not connected to each other. In an embodiment, as shown in FIG. 4A, the first doped region 104, the third doped region 108, and the sixth doped region 206 are electrically connected to the first voltage V1, and the second doped region 106, the fifth doped region 204, and the seventh doped region 208 are electrically connected to the second voltage V2. In an embodiment, the first voltage V1 and the second voltage V2 are different. When the first voltage V1 is the power supply voltage, the second voltage V2 is the ground voltage, and vice versa. In other words, in the transient voltage suppression device 2 of the second embodiment, the electrical potential of the third doped region 108 may be different from the electrical potential of the seventh doped region 208.

Figure 4B:
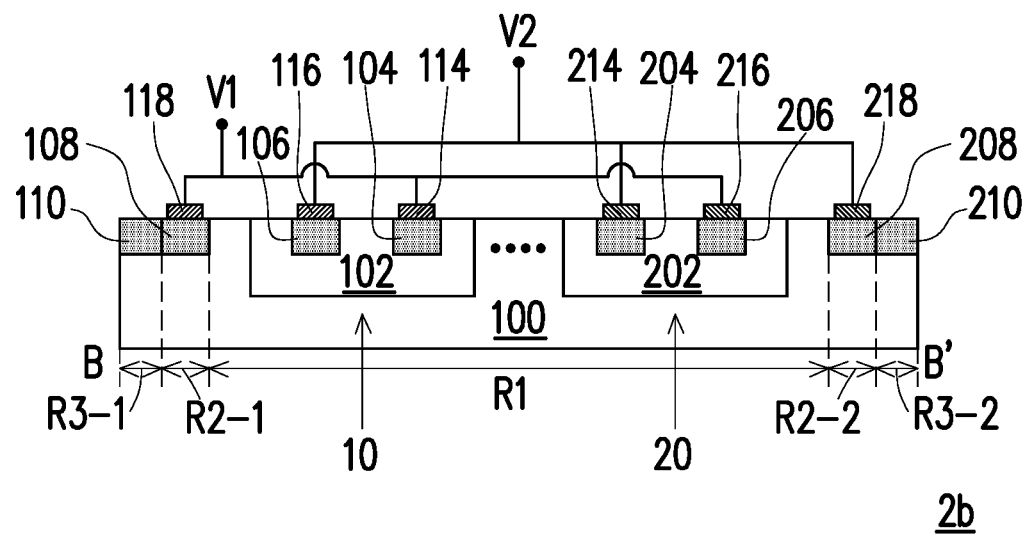
FIG. 4B is a schematic cross-sectional view taken along the line B-B' of FIG. 3.

FIG. 4B is a schematic cross-sectional view taken along the line B-B' of FIG. 3.

With reference to FIG. 4A and FIG. 4B, basically, a transient voltage suppression device 2b of FIG. 4B is similar to the transient voltage suppression device 2a of FIG. 4A. A difference therebetween is that the transient voltage suppression device 2b of FIG. 4B further includes the fourth doped region 110 having the second conductivity type and the eighth doped region 210 having the second conductivity type. To be specific, the fourth doped region 110 is located in the substrate 100 of the region R3-1, is located aside or next to the third doped region 108, and is in contact with the third doped region 108. The eighth doped region 210 is located in the substrate 100 of the region R3-2, is located aside or next to the seventh doped region 208, and is in contact with the seventh doped region 208. In an embodiment, the fourth doped region 110 and the eighth doped region 210 are separated from each other and are not connected to each other. As shown in FIG. 4B, the fourth doped region 110 may be electrically connected to the first voltage V1 through the third doped region 108. Similarly, the eighth doped region 210 may also be electrically connected to the second voltage V2 through the seventh doped region 208. That is, the electrical potential of the fourth doped region 110 and the electrical potential of the eighth doped region 210 are different.

Figure 5:
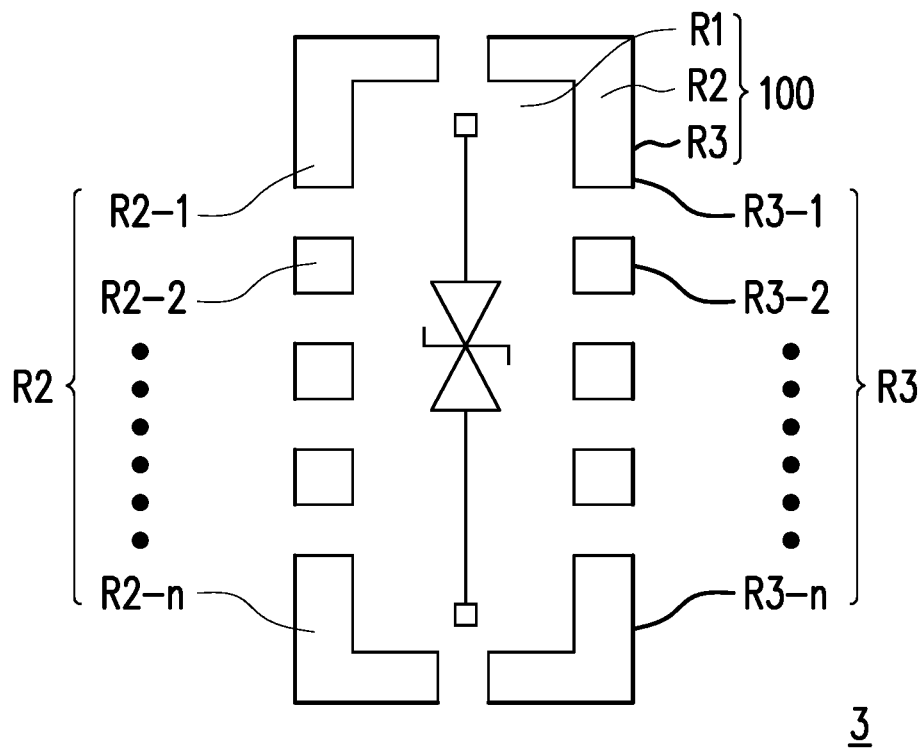
FIG. 5 is a schematic top view of a transient voltage suppression device according to a third embodiment of the invention.

FIG. 5 is a schematic top view of a transient voltage suppression device according to a third embodiment of the invention.

With reference to FIG. 1 and FIG. 5, basically, a transient voltage suppression device 3 of the third embodiment is similar to the transient voltage suppression device 1 of the first embodiment. A difference therebetween is that the seal-ring region R2 of the transient voltage suppression device 3 of the third embodiment is not an annular region. To be specific, the seal-ring region R2 of the transient voltage suppression device 3 of the third embodiment is divided into a plurality of regions R2-1, R2-2, . . . , and R2-$n$ distributed along a periphery of the device region R1. A plurality of the third doped regions are included in the regions R2-1, R2-2, . . . , and R2-$n$. The third doped regions are also distributed along the periphery of the device region R1. In an embodiment, the third doped regions may share the same electrical potential. In another embodiment, the electrical potentials of the third doped regions may be different.

In an alternative embodiment, the scribe line region R3 of the transient voltage suppression device 3 of the third embodiment are also divided into a plurality of regions R3-1, R3-2, . . . , and R3-$n$ corresponding to the regions R2-1, R2-2, . . . , and R2-$n$ respectively. A plurality of the fourth doped regions are included in the regions R3-1, R3-2, . . . , and R3-$n$. The fourth doped regions are disposed aside or next to the third doped regions. In an embodiment, the fourth doped regions may share the same electrical potential. In another embodiment, the electrical potentials of the fourth doped regions may be different.

In view of the foregoing, in the invention, the third doped region in the seal-ring region is electrically connected to the transient voltage suppressor, as such, the effective area of the device is increased, and that the endurance to electrostatic discharge and surge is enhanced. In addition, the transient voltage suppression device of the invention further includes the fourth doped region formed in the substrate of the scribe line region. In this way, the fourth doped region is in contact with and the third doped region, so as to shunt the electrostatic discharge current or the surge current.

In addition, the number of the transient voltage suppressors is plural, and the plural transient voltage suppressors are Zener diodes with bi-directional discharge. Therefore, the electrostatic discharge current or the surge current can be shunted into the third doped region in the seal-ring region and the fourth doped region in the scribe line region at the two sides of the device region, as such, the equivalent capacitance is lowered and the operation speed is further enhanced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A transient voltage suppression device, comprising:
    a substrate, comprising a device region and a seal-ring region, the seal-ring region surrounding the device region;
    a first transient voltage suppressor, located in the device region, the first transient voltage suppressor comprising:
    a first well region having a first conductivity type, located in substrate of the device region;
    a first doped region having a second conductivity type, located in the first well region; and
    a second doped region having the second conductivity type, located in the first well region; and
    a third doped region having the second conductivity type, located in the substrate of the seal-ring region, wherein the third doped region is electrically connected to the first doped region.

2. The transient voltage suppression device as claimed in claim 1, wherein the second doped region is located between the first doped region and the third doped region.

3. The transient voltage suppression device as claimed in claim 1, wherein the first doped region, the second doped region, and the third doped region are separated from one another.

4. The transient voltage suppression device as claimed in claim 1, wherein a gate structure is free from on the first well region between the first doped region and the second doped region.

5. The transient voltage suppression device as claimed in claim 1, further comprising:
    a second transient voltage suppressor, located in the device region, the second transient voltage suppressor comprising:
    a second well region having the first conductivity type, located in substrate of the device region;
    a fifth doped region having the second conductivity type, located in the second well region; and
    a sixth doped region having the second conductivity type, located in the second well region; and
    a seventh doped region having the second conductivity type, located in the substrate of the seal-ring region.

6. The transient voltage suppression device as claimed in claim 5, wherein the first doped region, the third doped region, the fifth doped region, and the seventh doped region are electrically connected to a first voltage, the second doped region and the sixth doped region are electrically connected to a second voltage, and the first voltage and the second voltage are different.

7. The transient voltage suppression device as claimed in claim 5, wherein the first doped region, the third doped region, and the sixth doped region are electrically connected to a first voltage, the second doped region, the fifth doped region, and the seventh doped region are electrically connected to a second voltage, and the first voltage and the second voltage are different.

8. The transient voltage suppression device as claimed in claim 1, wherein the substrate further comprises a scribe line region, and the scribe line region is adjacent to the seal-ring region, wherein the seal-ring region is located between the device region and the scribe line region.

9. The transient voltage suppression device as claimed in claim 8, further comprising a fourth doped region having the second conductivity type, the fourth doped region being located in the substrate of the scribe line region, wherein the fourth doped region is located aside and in contact with the third doped region.

10. The transient voltage suppression device as claimed in claim 9, further comprising:
    a metal layer, disposed on the substrate,
    wherein the metal layer is free from on the fourth doped region.

11. The transient voltage suppression device as claimed in claim 5, wherein the second transient voltage suppressor comprises a plurality of second transient voltage suppressors, and a plurality of the second well regions in the plurality of the second transient voltage suppressors are separated from one another and are not connected to one another.

12. The transient voltage suppression device as claimed in claim 5, wherein the first transient voltage suppressor and the second transient voltage suppressor are Zener diodes with bi-directional discharge.

13. The transient voltage suppression device as claimed in claim 5, wherein the first well region and the second well region are both electrically floating.

14. The transient voltage suppression device as claimed in claim 1, wherein the substrate has the second conductivity type and is electrically floating.

* * * * *